(12) United States Patent
Jang et al.

(10) Patent No.: US 10,177,179 B2
(45) Date of Patent: Jan. 8, 2019

(54) THIN-FILM TRANSISTOR DEVICE

(71) Applicant: Daegu Gyeongbuk Institute of Science and Technology, Dalseong-gun, Daegu (KR)

(72) Inventors: Jae Eun Jang, Daegu (KR); Byoungok Jun, Gyeongsangbuk-do (KR); Hongsoo Choi, Daegu (KR); Ji-Woong Choi, Daegu (KR); Kwon Sik Shin, Cheonan-si (KR); Young Jin Lee, Daegu (KR)

(73) Assignee: Daegu Gyeongbuk Institute of Science and Technology (KR)

( * ) Notice: Subject to any disclaimer, the term of this patent is extended or adjusted under 35 U.S.C. 154(b) by 34 days.

(21) Appl. No.: 15/472,651

(22) Filed: Mar. 29, 2017

(65) Prior Publication Data

US 2017/0301704 A1   Oct. 19, 2017

(30) Foreign Application Priority Data

Apr. 19, 2016   (KR) .................. 10-2016-0047676

(51) Int. Cl.
*H01Q 1/38*   (2006.01)
*H01L 27/12*  (2006.01)
(Continued)

(52) U.S. Cl.
CPC .......... *H01L 27/1255* (2013.01); *H01L 23/58* (2013.01); *H01L 28/10* (2013.01);
(Continued)

(58) Field of Classification Search
CPC .......... H01Q 1/243; H01Q 21/28; H01Q 1/38; H01Q 1/48; H01Q 1/36; H01Q 9/27; H01Q 1/364
(Continued)

(56) References Cited

U.S. PATENT DOCUMENTS 8,041,309 B2 * 10/2011 Kurokawa .......... G06F 15/7832
                                                    455/73
8,049,669 B2 * 11/2011 Yamazaki ........ G06K 19/07728
                                                    343/700 MS
(Continued)

FOREIGN PATENT DOCUMENTS

JP     2014078725 A    5/2014
KR    1020070081236    8/2007

OTHER PUBLICATIONS

Jun, Byoung-Ok et al., "The study of wireless thin film transistor with micro magnetic induction coupling antenna structure", IEEE International Conference on Nanotechnology, Aug. 18-21, 2014, Toronto, Canada.
(Continued)

*Primary Examiner* — Linh Nguyen
(74) *Attorney, Agent, or Firm* — Miller Canfield

(57) ABSTRACT

A thin-film transistor (TFT) device may include a data line and a gate line formed on a base substrate, a TFT connected to the data line and the gate line, and a magnetic field antenna spaced apart from the data line and the gate line on the base substrate. The magnetic field antenna may be connected to the TFT and configured to transmit and receive a signal to and from the TFT or to control a driving of the TFT.

13 Claims, 9 Drawing Sheets

(51) Int. Cl.
   H01L 23/58    (2006.01)
   H01L 49/02    (2006.01)
   H01Q 1/22     (2006.01)
   H03K 17/687   (2006.01)
   H01L 29/786   (2006.01)

(52) U.S. Cl.
   CPC ......... *H01Q 1/2283* (2013.01); *H03K 17/687* (2013.01); *H01L 27/1225* (2013.01); *H01L 29/7869* (2013.01)

(58) Field of Classification Search
   USPC .......................... 343/720, 878, 895, 700 MS
   See application file for complete search history.

(56) References Cited

U.S. PATENT DOCUMENTS

| | | | | |
|---|---|---|---|---|
| 9,935,363 B2* | 4/2018 | Fujii | ............... | H01Q 1/2225 |
| 2005/0130389 A1* | 6/2005 | Yamazaki | ........... | H01L 27/1214 438/455 |
| 2007/0085202 A1* | 4/2007 | Shionoiri | ......... | G06K 19/07745 257/734 |
| 2007/0120681 A1* | 5/2007 | Yamazaki | ........ | G06K 19/07749 340/572.8 |
| 2007/0229279 A1* | 10/2007 | Yamazaki | .......... | G06K 19/0701 340/572.7 |
| 2007/0229281 A1* | 10/2007 | Shionoiri | ......... | G06K 19/06037 340/572.7 |
| 2009/0087930 A1* | 4/2009 | Arai | ................... | G01R 31/2886 438/17 |
| 2009/0102055 A1* | 4/2009 | Aoki | ................ | G06K 19/07749 257/773 |
| 2014/0329707 A1* | 11/2014 | Naughton | .......... | A61B 5/04001 506/9 |

OTHER PUBLICATIONS

Byoung Ok Jun et al. "Wireless thin film transistor based on micro magnetic induction coupling antenna." Scientific Reports (Dec. 22, 2015), www.nature.com/scientificreports.

\* cited by examiner

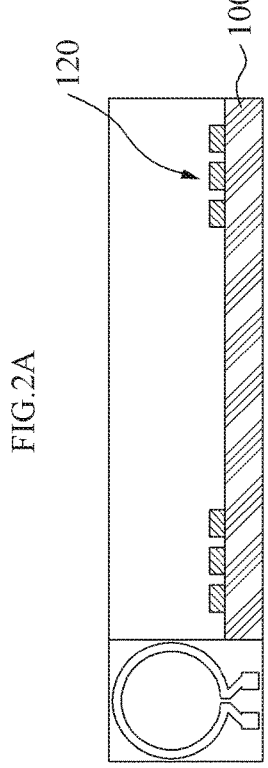
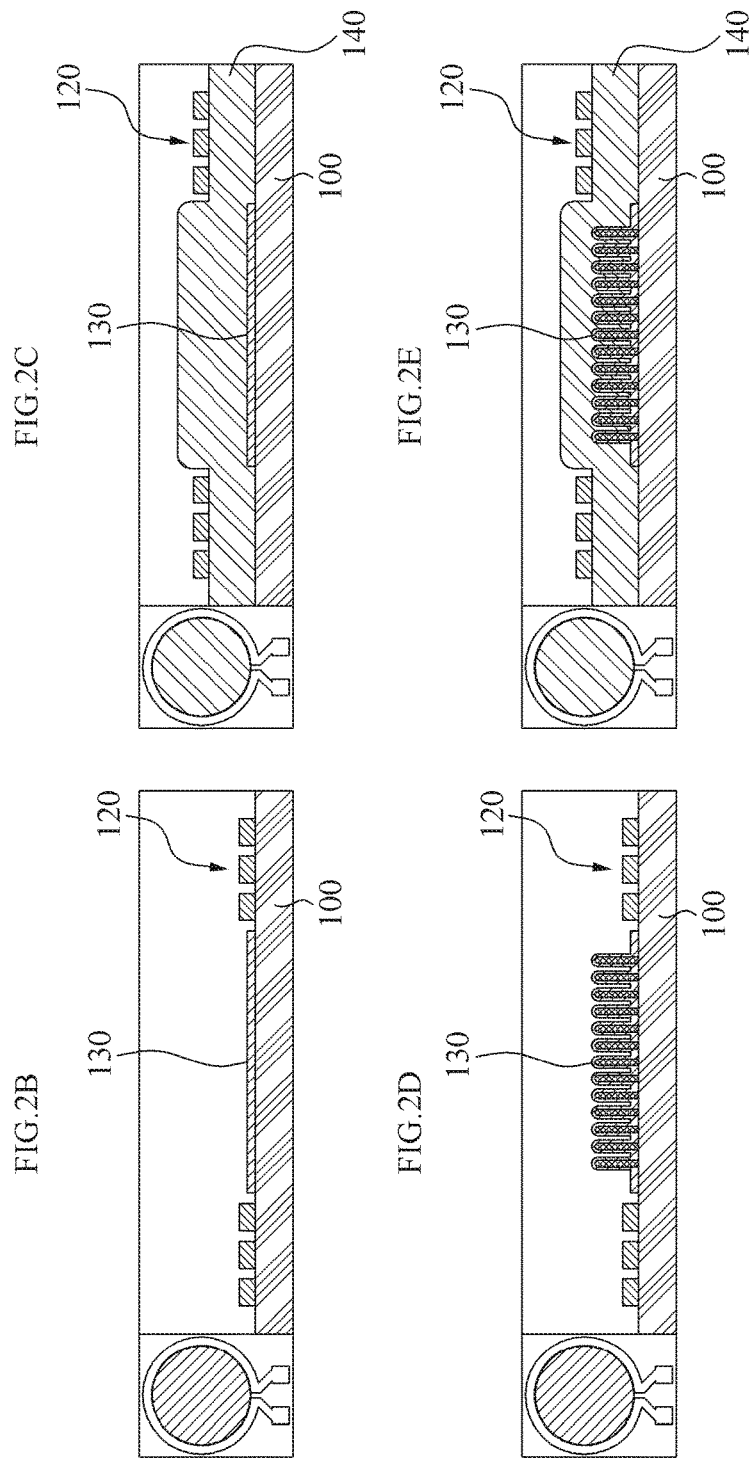

THIN-FILM TRANSISTOR DEVICE

CROSS-REFERENCE TO RELATED APPLICATION

This application claims the benefit of Korean Patent Application No. 10-2016-0047676, filed on Apr. 19, 2016, in the Korean Intellectual Property Office, the disclosure of which is incorporated herein by reference.

BACKGROUND

1. Technical Field

At least one example embodiment relates to a thin-film transistor (TFT) device, and more particularly, to a TFT device in which a TFT is connected to a magnetic field antenna so that signals may be transmitted and received between the TFT and the magnetic field antenna or so that a driving of the TFT may be controlled by the magnetic field antenna.

2. Description of the Related Art

A thin-film transistor (TFT) is being used in various electronic devices, for example, a flat panel display, and the like.

For example, a TFT may be used as a switching device or a driving device in a flat panel display, for example, a liquid crystal display (LCD), an organic light-emitting diode (OLED) display or an electrophoretic display. Also, the TFT may be used as a logic circuit in other devices.

The TFT may include a gate electrode connected to a gate line that transfers a scanning signal, a source electrode connected to a data line that transfers a signal to be applied to pixels, a drain electrode that faces the source electrode, and a semiconductor layer that is electrically connected to the source electrode and the drain electrode.

Recently, an LCD is emerging as a next-generation display, because the LCD enables full colorization and has advantages of a high resolution, a low power and eco-friendly characteristic along with a lightweight and compact configuration, in comparison to a typical cathode ray tube (CRT) display. Also, an interest in TFTs is rapidly increasing and is being developed in various ways.

For example, a "TFT substrate" has been disclosed in Korean Patent Application No. 10-2006-0013032 filed on Feb. 10, 2006.

SUMMARY

An aspect provides a thin-film transistor (TFT) device in which a TFT is connected to a magnetic field antenna so that a driving of the TFT may be wirelessly controlled and that signals may be wirelessly transmitted and received between the TFT and the magnetic field antenna.

Another aspect provides a TFT device that may prevent a TFT from being deactivated due to a short-circuit of a connection wiring while maintaining a size effect of the TFT using a subminiature magnetic field antenna.

Still another aspect provides a TFT device that may minimize an interference between a plurality of TFTs by changing a structure of a magnetic field antenna and that may operate a portion of the plurality of TFTs by changing a frequency of the magnetic field antenna when the plurality of TFTs are provided.

Yet another aspect provides a TFT device that may be applied to various electronic devices, for example, an implantable device and a subminiature wireless sensor (for example, an Internet of things (IoT) sensor) as well as a display (for example, a flexible display). For example, the TFT device may wirelessly control each of pixels of a display.

According to another aspect, there is provided a TFT device including a data line and a gate line formed on a base substrate, a TFT connected to the data line and the gate line, and a magnetic field antenna spaced apart from the data line and the gate line on the base substrate, wherein the magnetic field antenna is connected to the TFT and configured to transmit and receive a signal to and from the TFT or to control a driving of the TFT.

The TFT may include a source electrode and a drain electrode connected to the data line, and a gate electrode connected to the gate line. The magnetic field antenna may be connected to at least one of the source electrode, the drain electrode or the gate electrode.

One end of the magnetic field antenna may be connected to the source electrode, and another end of the magnetic field antenna may be connected to the gate electrode.

One end of the magnetic field antenna may be connected to the source electrode, and another end of the magnetic field antenna may be connected to the drain electrode.

The TFT device may further include an additional magnetic field antenna spaced apart from the magnetic field antenna and the TFT may be located between the magnetic field antennas on the base substrate.

One end of the magnetic field antenna may be connected to the source electrode, and another end of the magnetic field antenna may be connected to the gate electrode. One end of the additional magnetic field antenna may be connected to the source electrode, and another end of the additional magnetic field antenna may be connected to the drain electrode.

The magnetic field antenna may be an antenna configured to enable a wireless communication by a magnetic field. The magnetic field antenna may be configured to transmit, to the TFT, a signal that is wirelessly received from an external device, or configured to wirelessly transmit, to the external device, a signal that is transferred by the TFT.

The magnetic field antenna may be provided in a form of a planar coil.

A core member formed of a magnetic material or a core member including a nanowire coated with a magnetic material may be located in a central portion of the magnetic field antenna.

The core member formed of the magnetic material may be provided in a form of a circular plate to correspond to a shape of the central portion, and a top surface of the core member formed of the magnetic material may be lower than a top surface of the magnetic field antenna.

A top surface of the core member including the nanowire may be higher than the top surface of the magnetic field antenna.

An insulating member may be located between the magnetic field antenna and at least one of the core members, or at least one of the core members may be coated with an insulating material. The insulating member or the insulating material may inhibit generation of an eddy current on a surface of at least one of the core members.

A diode and a capacitor may be located between the magnetic field antenna and the TFT and may be configured to convert an alternating current (AC) signal that is transmitted to the TFT into a direct current (DC) signal.

According to another aspect, there is provided a TFT device including a base substrate, a first TFT connected to the base substrate, a first magnetic field antenna connected to the first TFT and configured to control a driving of the first TFT, a second TFT connected to the base substrate, and a second magnetic field antenna connected to the second TFT and configured to control a driving of the second TFT, wherein the first TFT and the second TFT are individually controlled by the first magnetic field antenna and the second magnetic field antenna.

The first magnetic field antenna or the second magnetic field antenna may be provided in a form of a planar coil. A resonant frequency of the first magnetic field antenna or the second magnetic field antenna may change by adjusting a number of turns, a width, a thickness or a spacing of the first magnetic field antenna or the second magnetic field antenna.

One end of the first magnetic field antenna may be connected to a source electrode of the first TFT and another end of the first magnetic field antenna may be connected to a gate electrode of the first TFT. One end of the second magnetic field antenna may be connected to a source electrode of the second TFT and another end of the second magnetic field antenna may be connected to a gate electrode of the second TFT.

The TFT device may further include an additional magnetic field antenna connected to the first magnetic field antenna and the second magnetic field antenna in an opposite direction to a direction in which the first TFT and the second TFT are connected to the first magnetic field antenna and the second magnetic field antenna, respectively, on the base substrate.

A diameter of the additional magnetic field antenna may be greater than a diameter of each of the first magnetic field antenna and the second magnetic field antenna.

The first magnetic field antenna and the second magnetic field antenna may be configured to transmit and receive signals to and from the first TFT and the second TFT, respectively. The additional magnetic field antenna may be connected to each of the first TFT and the second TFT and configured to supply operating power to each of the first TFT and the second TFT.

One end of the additional magnetic field antenna may extend toward the first magnetic field antenna and the second magnetic field antenna and may diverge to be connected to a drain electrode of the first TFT and a drain electrode of the second TFT.

Additional aspects of example embodiments will be set forth in part in the description which follows and, in part, will be apparent from the description, or may be learned by practice of the disclosure.

BRIEF DESCRIPTION OF THE DRAWINGS

These and/or other aspects, features, and advantages of the invention will become apparent and more readily appreciated from the following description of example embodiments, taken in conjunction with the accompanying drawings of which:

FIGS. 2A, 2B, 2C, 2D and 2E are drawings illustrating examples of a core member included in a magnetic field antenna according to an example embodiment;

DETAILED DESCRIPTION

Figure 1A:
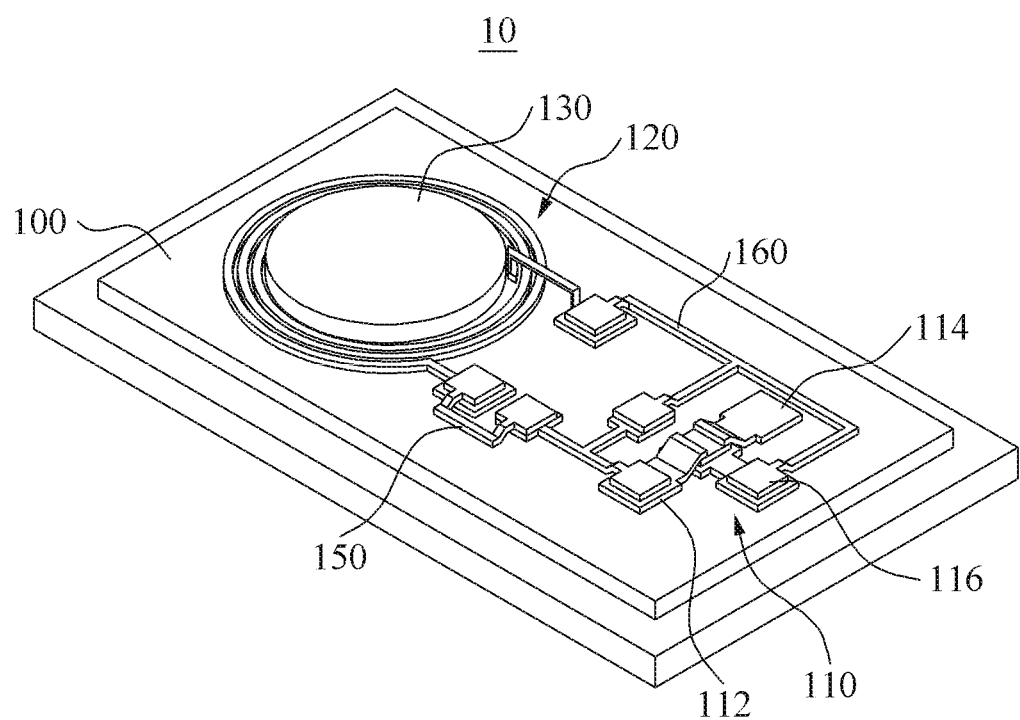
FIGS. 1A, 1B and 1C are drawings illustrating an example of a thin-film transistor (TFT) device according to an example embodiment.

Hereinafter, some example embodiments will be described in detail with reference to the accompanying drawings. In the following description, the same elements will be designated by the same reference numerals although they are shown in different drawings. Also, in the following description of example embodiments, a detailed description of known functions and configurations incorporated herein will be omitted when it may make the subject matter of the present disclosure rather unclear.

Also, to describe components according to example embodiments, the terms first, second, A, B, (a), (b), etc. may be used herein. These terms are merely used to distinguish one component from another, but not to imply or suggest the substances, order or sequence of the components. It will be understood that when one component is described as being "connected," "coupled," or "linked" to another component, it can be directly connected or coupled to the other component, or still other component can be interposed between the two components.

Figure 1B:
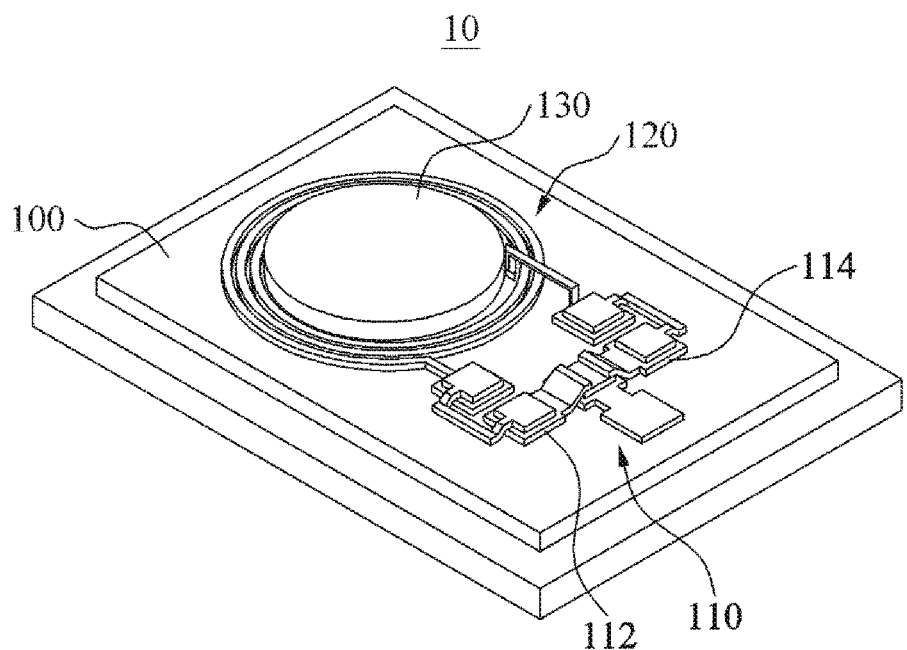
Figure 1C:
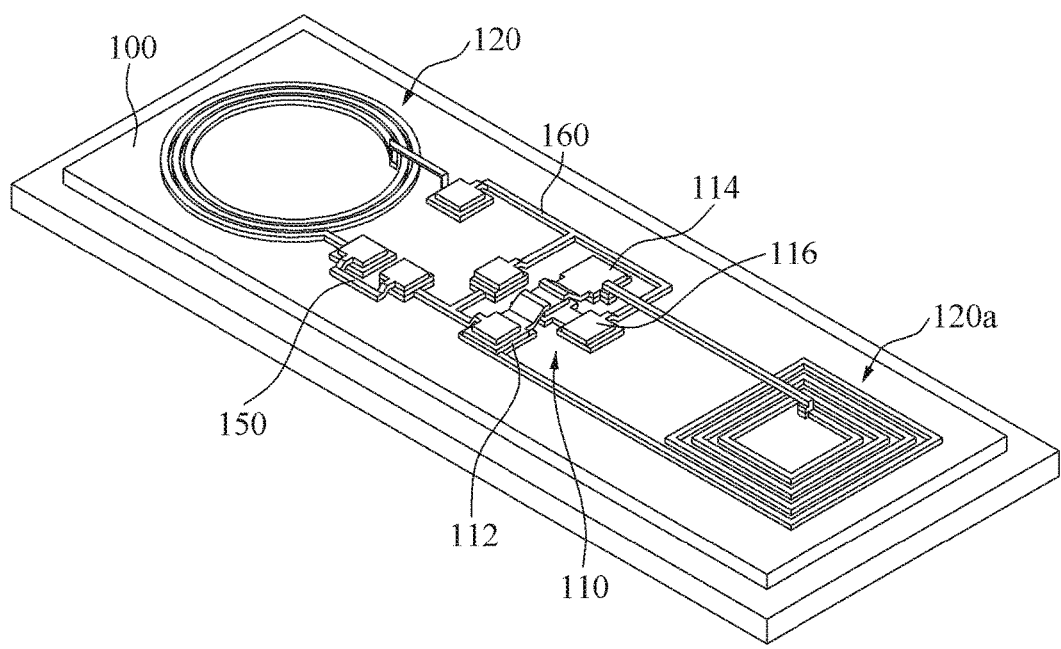
Figure 3:
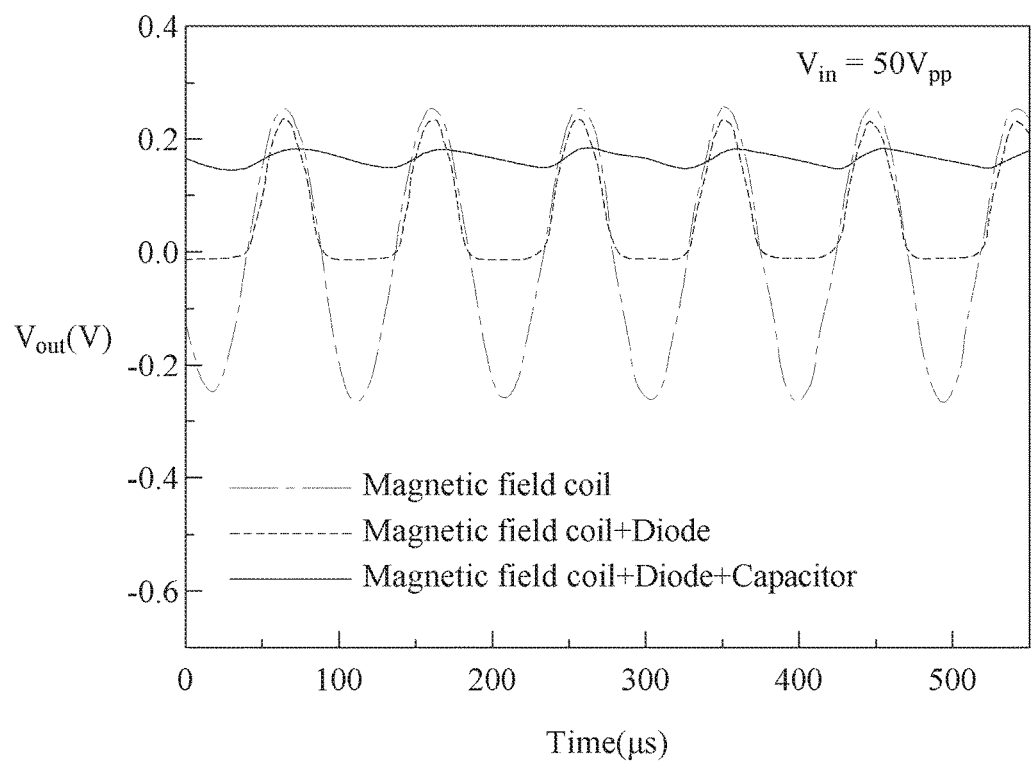
FIG. 3 is a graph illustrating a change in an output voltage by a diode and a capacitor according to an example embodiment.

FIGS. 1A, 1B and 1C illustrate a thin-film transistor (TFT) device 10 according to an example embodiment, and FIGS. 2A, 2B, 2C, 2D and 2E illustrate examples of a core member 130 included in a magnetic field antenna 120 according to an example embodiment. FIG. 3 is a graph illustrating a change in an output voltage by a diode and a capacitor according to an example embodiment.

Referring to FIGS. 1A through 1C, the TFT device 10 may include a base substrate 100, a TFT 110 and the magnetic field antenna 120.

The base substrate 100 may include, for example, a plastic substrate with a flexibility as well as a glass substrate.

The plastic substrate may be formed of an organic insulating material, for example, polyethersulphone (PES), polyacrylate (PAR), polyetherimide (PEI), Polyethylene naphthalate (PEN), polyethylene terephthalate (PET), polyphenylene sulfide (PPS), polyarylate, polyimide, polycarbonate (PC), cellulose triacetate (TAC), and cellulose acetate propinonate (CAP).

Although not shown in detail in the drawings, it is obvious that an oxide semiconductor layer or a buffer layer may be located on the base substrate 100.

Also, the base substrate 100 may include a plurality of layers, and different patterns or the same pattern may be formed on each of the layers.

In addition, a data line and a gate line may be formed on the base substrate 100, although not shown in the drawings.

For example, a data line may extend in a first direction in one side of the base substrate 100, and a gate line may be patterned to extend in a second direction that vertically intersects the data line.

In this example, a source region may be formed at one end of the data line, and a drain region may be formed at another end of the data line.

The TFT 110 may be connected to the data line and the gate line.

A channel that supplies a gate driving signal to a gate line of the TFT 110 may be formed of various semiconductor materials and desirably, a material capable of enabling a high-speed operation based on a driving frequency of the magnetic field antenna 120.

The TFT 110 may include a source electrode 112, a drain electrode 114 and a gate electrode 116.

The source electrode 112 may be located in the source region of the data line, and the drain electrode 114 may be located in the drain region of the data line. Also, the gate electrode 116 may be located on the gate line.

The source electrode 112 and the drain electrode 114 may face one another along the data line. The gate electrode 116 may be located along the gate line in a central portion between the source electrode 112 and the drain electrode 114.

The gate electrode 116 may be spaced apart from the source electrode 112 and the drain electrode 114 in an opposite direction to a direction in which the gate electrode 116 is spaced apart from the magnetic field antenna 120 on the base substrate 100. Accordingly, the TFT 110 may be spaced apart from the magnetic field antenna 120 on the base substrate 100 along the gate line.

The magnetic field antenna 120 may be connected to the above-described TFT 110.

The magnetic field antenna 120 may be a kind of an antenna configured to receive a magnetic wave of a wireless signal and to generate an alternating current (AC) voltage of a high frequency, and may enable a wireless communication by a magnetic field.

Since a magnetic field communication is not affected by a medium, signals may be transmitted and received between the magnetic field antenna 120 and an external device when the TFT device 10 is located under water or in a human body. Accordingly, a signal transmitted to the magnetic field antenna 120 may be transferred to the TFT 110 or may be used to control a driving of the TFT 110. Also, a signal transmitted from the TFT 110 may be transferred to the external device via the magnetic field antenna 120.

The magnetic field antenna 120 may have various shapes. In the following description, the magnetic field antenna 120 may be provided in a form of a planar coil.

Also, the magnetic field antenna 120 may have various sizes. Desirably, the magnetic field antenna 120 may have a compact size, for example, a size of 1 millimeter (mm) or less based on a size of the TFT 110.

The magnetic field antenna 120 may be spaced apart from the data line and the gate line on the base substrate 100, and may be connected to at least one of the source electrode 112, the drain electrode 114 or the gate electrode 116 of the TFT 110.

The magnetic field antenna 120 may include two electrodes. For example, when one end of the magnetic field antenna 120 is a positive electrode, another end of the magnetic field antenna 120 may be a negative electrode. Accordingly, the electrodes included in the magnetic field antenna 120 may be connected to at least one of the source electrode 112, the drain electrode 114 or the gate electrode 116 of the TFT 110.

Referring to FIG. 1A, a first electrode or one end of the magnetic field antenna 120 may be connected to the source electrode 112, and a second electrode or another end of the magnetic field antenna 120 may be connected to the gate electrode 116, which may be referred to as a "wireless gate system."

In FIG. 1A, the operation of the TFT 110 may be controlled by the magnetic field antenna 120. For example, the TFT 110 may be powered ON or OFF under a control of the magnetic field antenna 120.

An example in which the operation of the TFT 110 is controlled by the magnetic field antenna 120 is described below.

Although not shown in detail in the drawings, a transmission antenna (not shown) may apply an AC voltage with a driving frequency to operate the TFT 110 to the magnetic field antenna 120. A relatively high voltage may be transferred to the magnetic field antenna 120 in comparison to when a voltage is applied at another frequency.

For example, when a voltage transferred to the magnetic field antenna 120 exceeds a threshold voltage of the TFT 110, the TFT 110 may be powered ON. When the voltage does not exceed the threshold voltage, the TFT 110 may be powered OFF.

When the voltage transferred to the magnetic field antenna 120 is an appropriate voltage in a driving frequency range, the TFT 110 may be powered ON. When the voltage is out of the driving frequency range, the TFT 110 may be powered OFF.

In this example, based on a structure of the magnetic field antenna 120, a driving frequency of a voltage transmitted from the transmission antenna by a wireless power transmission may change. Also, a resonant circuit (not shown) may be additionally located between the transmission antenna and the magnetic field antenna 120, and accordingly the driving frequency of the voltage may change.

Referring to FIG. 1B, a first electrode or one end of the magnetic field antenna 120 may be connected to the source electrode 112 of the TFT 110, and a second electrode or another end of the magnetic field antenna 120 may be connected to the drain electrode 114 of the TFT 110, which may be referred to as a "wireless source/drain system."

In FIG. 1B, the magnetic field antenna 120 may receive a signal from the TFT 110, or may transmit a signal processed in the TFT 110 to an external device. Also, a signal may be transmitted from the magnetic field antenna 120 to the TFT 110, to control the TFT 110.

However, a connection structure between the TFT 110 and the magnetic field antenna 120 is not limited to that described above, and various schemes may be used.

For example, based on use of the TFT 110, a signal may be transmitted and received between the TFT 110 and the magnetic field antenna 120 as shown in FIG. 1A, or the operation of the TFT 110 may be controlled by a voltage applied to the magnetic field antenna 120 as shown in FIG. 1B. Also, one of the source electrode 112 and the drain electrode 114 of the TFT 110 may be connected to the magnetic field antenna 120, or the gate electrode 116 of the TFT 110 may be connected to the magnetic field antenna 120.

Referring to FIG. 1C, a magnetic field antenna 120 may be connected to the source electrode 112 and the gate electrode 116 of the TFT 110, and a magnetic field antenna 120a may be connected to the source electrode 112 and the drain electrode 114 of the TFT 110. Accordingly, the source electrode 112 and the gate electrode 116 may transmit and receive signals to and from the drain electrode 114, or the operation of the TFT 110 may be controlled.

For example, similarly, the magnetic field antenna 120 may be connected to the source electrode 112 and the drain electrode 114, and the magnetic field antenna 120a may be connected to the gate electrode 116. In this example, it is obvious that the source electrode 112 and the drain electrode 114 may transmit and receive signals, separately from the gate electrode 116, or that the operation of the TFT 110 may be controlled.

For example, both a wireless gate system and a wireless source/drain system may be formed on the base substrate 100. In this example, when the wireless gate system does not operate while the wireless source/drain system operates, the TFT 110 may be powered OFF. When the wireless source/drain system does not operate while the wireless gate system operates, the TFT 110 may be powered OFF.

Thus, it is possible to control a signal by controlling the wireless source/drain system in a state in which the wireless gate system operates. Also, it is possible to control a signal by controlling the wireless gate system in a state in which the wireless source/drain system operates.

Referring to FIGS. 2A through 2E, the core member 130 may be located in a central portion of the magnetic field antenna 120.

FIG. 2A illustrates an example in which the core member 130 is not located in the central portion of the magnetic field antenna 120.

In FIG. 2B, the core member 130 may be formed of a magnetic material and may be located in the central portion of the magnetic field antenna 120. Also, the core member 130 may be in a form of a circular plate to correspond to a shape of the central portion of the magnetic field antenna 120, and a top surface of the core member 130 may be lower than a top surface of the magnetic field antenna 120. The core member 130 may be formed of, for example, a lump formed of a magnetic material.

In FIG. 2C, the core member 130 may be formed of a magnetic material and may be located in the central portion of the magnetic field antenna 120. Also, the core member 130 may be in a form of a circular plate to correspond to the shape of the central portion of the magnetic field antenna 120. In addition, an insulating member 140 may be located between the magnetic field antenna 120 and the core member 130, or the core member 130 may be coated with an insulating material.

In the central portion of the magnetic field antenna 120, a top surface of the insulating member 140 may be higher than the top surface of the magnetic field antenna 120. Due to the insulating member 140, the magnetic field antenna 120 may be located in a higher position than the core member 130.

Generally, the core member 130 with a conductivity may have a high magnetic permeability based on a frequency in comparison to the insulating member 140. When a frequency further increases, the magnetic permeability of the core member 130 may rapidly decrease, which may cause an eddy current to be generated on a surface of the core member 130. As a result, the eddy current may reduce an efficiency of a wireless power transmission.

Accordingly, the insulating member 140 may be located between the magnetic field antenna 120 and the core member 130, as described above. Thus, it is possible to inhibit generation of the eddy current and to enhance the efficiency of the wireless power transmission.

Referring to FIG. 2D, the core member 130 may be provided in a form of a nanowire, and a thin film with a magnetic material may be formed in the nanowire.

The nanowire may include, for example, various metallic wires, a semiconductive wire such as ZnO, a wire formed of an insulating material such as $SiO_2$, or a carbon nanotube (CNT).

In FIG. 2D, the core member 130 may protrude upwards from a top surface of the base substrate 100, and accordingly a top surface of the core member 130 may be higher than the top surface of the magnetic field antenna 120.

Since the core member 130 is provided in the form of the nanowire, a surface area of the core member 130 may increase, and a flux intensity of the magnetic field antenna 120 may also increase. Thus, it is possible to enhance an efficiency of transmission and reception of a wireless signal.

Referring to FIG. 2E, the core member 130 may be provided in a form of a nanowire, and a thin film with a magnetic material may be formed in the nanowire. Also, the core member 130 may be located below the magnetic field antenna 120 in the central portion of the magnetic field antenna 120.

In FIG. 2E, an insulating member 140 may be located between the magnetic field antenna 120 and the core member 130, or the core member 130 may be coated with an insulating material. Due to the insulating member 140, the top surface of the magnetic field antenna 120 may be higher than the top surface of the core member 130, and the top surface of the insulating member 140 may be higher than the top surface of the magnetic field antenna 120 in the central portion of the magnetic field antenna 120.

Also, a diode 150 and a capacitor 160 may be connected between the TFT 110 and the magnetic field antenna 120.

The diode 150 and the capacitor 160 may convert an AC signal that is transmitted to and received from the TFT 110 into a direct current (DC) signal. For example, the diode 150 may be connected to one end of the magnetic field antenna 120 and the source electrode 112 of the TFT 110, and the capacitor 160 may be connected to another end of the magnetic field antenna 120.

FIG. 3 illustrates an example in which an AC signal transmitted to the magnetic field antenna 120 via a wireless power transmission is converted into a DC signal when the diode 150 and the capacitor 160 are connected to the TFT 110 and the magnetic field antenna 120.

However, there is no limitation to the above configuration for converting the AC signal into the DC signal, and it is obvious that a bridge rectifier circuit may be connected.

Hereinafter, another example of a TFT device will be described below.

Figure 4A:
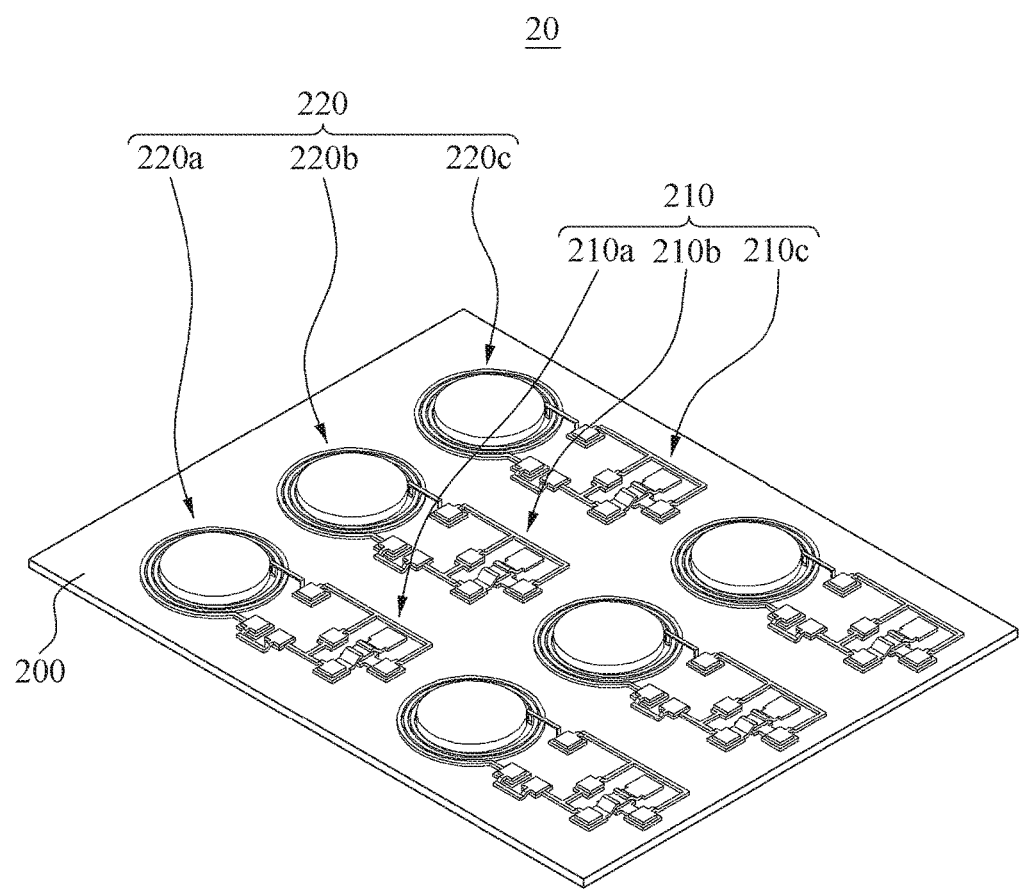
FIGS. 4A and 4B are drawings illustrating another example of a TFT device according to an example embodiment.
Figure 4B:
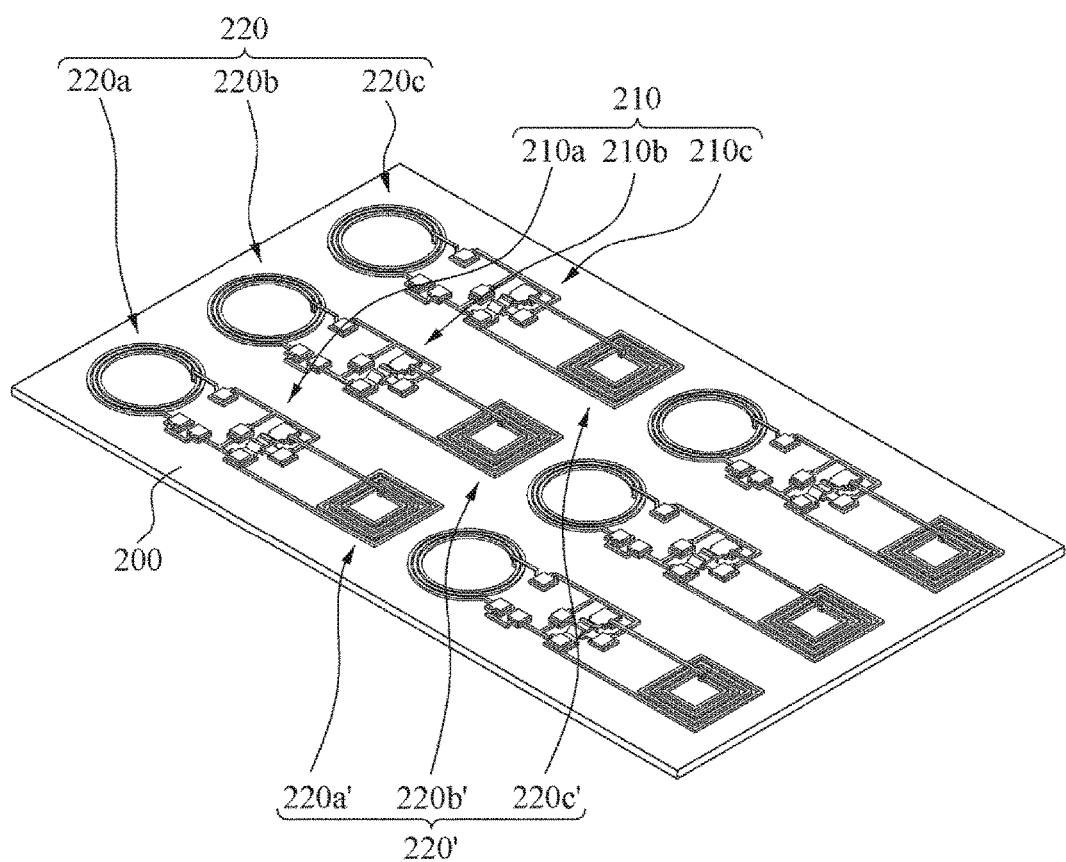
Figure 5:
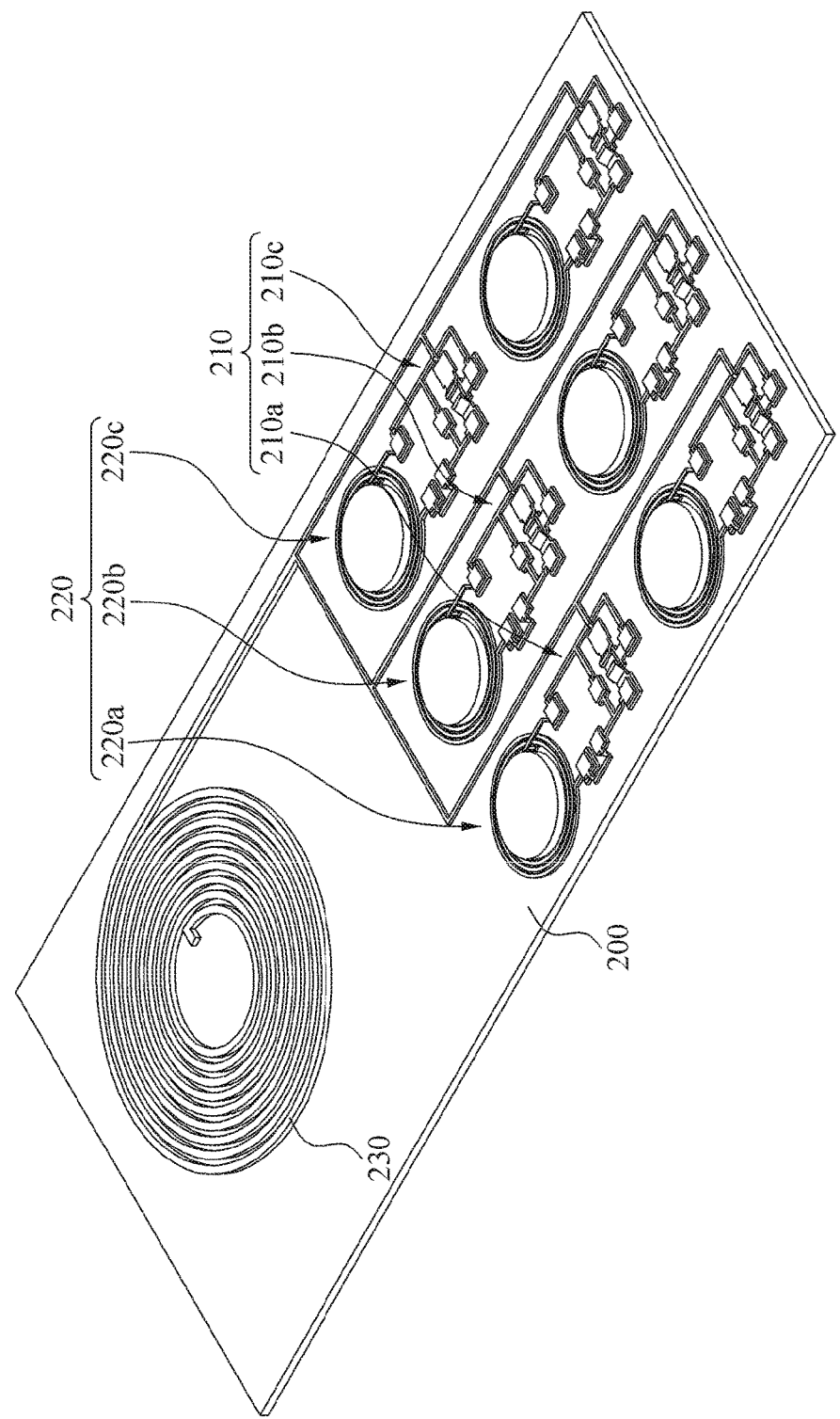
FIG. 5 is a drawing illustrating an example in which an additional magnetic field antenna is included in the TFT device of FIG. 4A.
Figure 6:
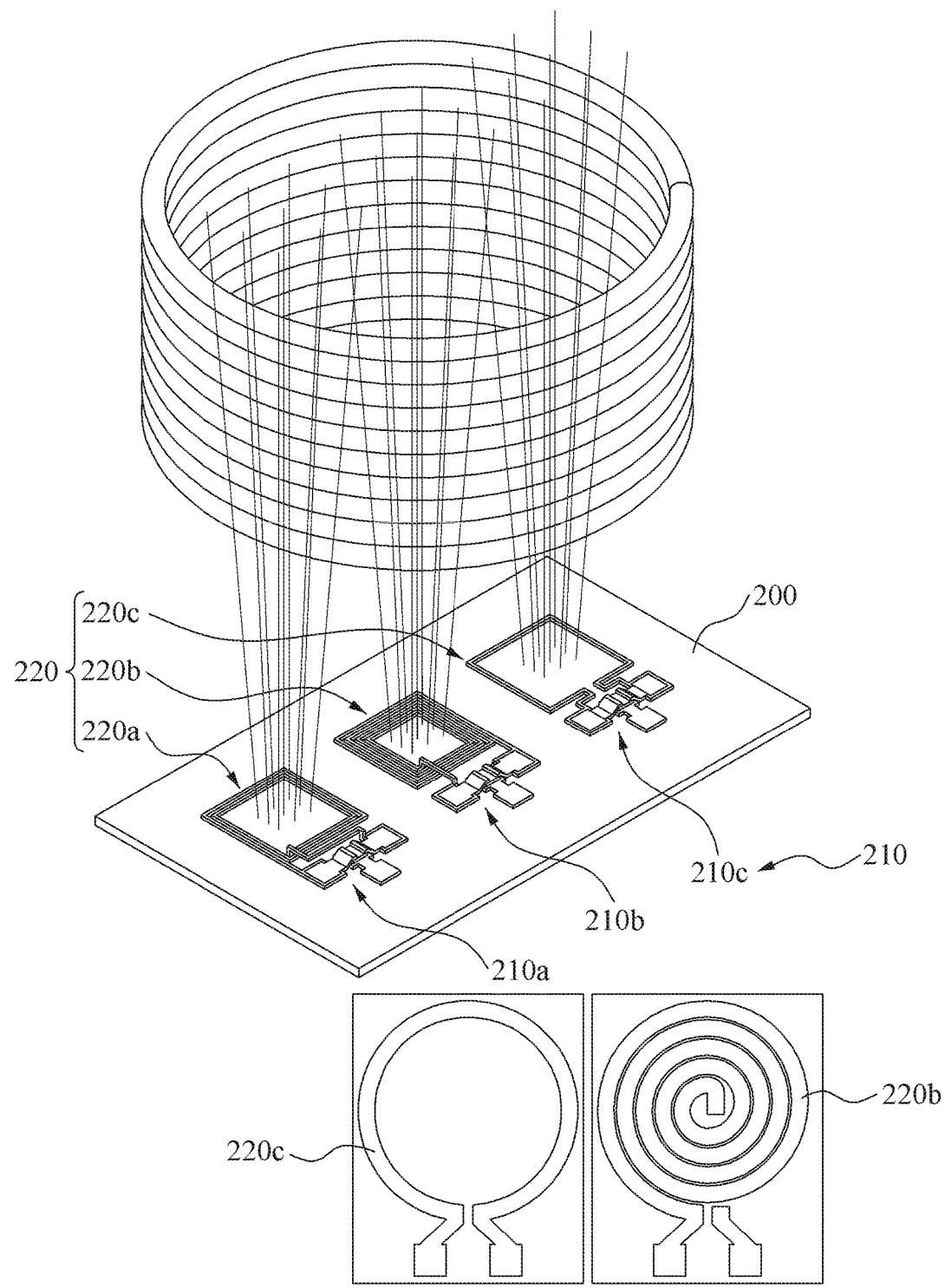
FIG. 6 is a drawing illustrating an example in which magnetic field antennas with different structures are located in a plurality of TFTs according to an example embodiment.

FIGS. 4A and 4B illustrate a TFT device 20 according to an example embodiment, and FIG. 5 illustrates an example in which an additional magnetic field antenna 230 is included in the TFT device 200 of FIG. 4A. FIG. 6 illustrates an example in which magnetic field antennas with different structures are located in a plurality of TFTs according to an example embodiment.

Referring to FIGS. 4A and 4B, the TFT device 20 may include a base substrate 200, a plurality of TFTs 210 and a plurality of magnetic field antennas 220.

In the following description, the plurality of TFTs 210 may include a first TFT 210a, a second TFT 210b and a third TFT 210c, and the plurality of magnetic field antennas 220 may include a first magnetic field antenna 220a, a second magnetic field antenna 220b and a third magnetic field antenna 220c.

However, a number of the plurality of TFTs 210 and a number of the plurality of magnetic field antennas 220 are not limited thereto, and may vary depending on a size of an electronic device to which the TFT device 20 is applicable. For example, it is obvious that the plurality of TFTs 210 may include a first TFT and a second TFT, and the plurality of magnetic field antennas 220 may include a first magnetic field antenna and a second magnetic field antenna.

Also, in FIGS. 4A and 4B, the plurality of TFTs 210 may be spaced apart from each other at equal intervals and the plurality of magnetic field antennas 220 may be spaced apart from each other at equal intervals on a single base substrate 200, however, there is no limitation thereto. For example, the plurality of TFTs 210 and the plurality of magnetic field antennas 220 may be individually located on base substrates 200. Also, an arrangement of the plurality of TFTs 210 and the plurality of magnetic field antennas 220 may vary depending on a shape of an electronic device to which the TFT device 20 is applicable.

For example, when the TFT device 20 is applied to a display, the base substrate 200 may include a plurality of pixels, for example, a first pixel, a second pixel and a third pixel, although not shown in the drawings.

In this example, the first pixel may be formed on an intersection point between a first gate line and a first data line associated with the first TFT 210a, the second pixel may be formed on an intersection point between a second gate line and a second data line associated with the second TFT 210b, and the third pixel may be formed on an intersection point between a third gate line and a third data line associated with the third TFT 210c, although not shown in the drawings.

Also, the first TFT 210a, the second TFT 210b and the third TFT 210c may be connected to the first pixel, the second pixel and the third pixel, respectively. The first magnetic field antenna 220a, the second magnetic field antenna 220b and the third magnetic field antenna 220c may be connected to the first TFT 210a, the second TFT 210b and the third TFT 210c, respectively.

The first TFT 210a, the second TFT 210b and the third TFT 210c may be connected to the first magnetic field antenna 220a, the second magnetic field antenna 220b and the third magnetic field antenna 220c in the same manner as in that of the wireless gate system of FIG. 1A or the wireless source/drain system of FIG. 1B, and accordingly further description is not repeated herein.

Thus, a driving of the first TFT 210a may be controlled by the first magnetic field antenna 220a, and a driving of the second TFT 210b may be controlled by the second magnetic field antenna 220b. Also, a driving of the third TFT 210c may be controlled by the third magnetic field antenna 220c.

For example, when the first TFT 210a is powered OFF by the first magnetic field antenna 220a, the first pixel may be OFF. When the second TFT 210b is powered ON by the second magnetic field antenna 220b, the second pixel may be ON.

Also, brightness of the first pixel may decrease by a signal transmitted to the first TFT 210a by the first magnetic field antenna 220a, and brightness of the second pixel may increase by a signal transmitted to the second TFT 210b by the second magnetic field antenna 220b.

As described above, the first TFT 210a, the second TFT 210b and the third TFT 210c may be individually controlled by the first magnetic field antenna 220a, the second magnetic field antenna 220b and the third magnetic field antenna 220c. Thus, when the TFT device 20 is applied to the display, the first pixel, the second pixel and the third pixel may be individually controlled, and different signals or the same signal may be transmitted to the first pixel, the second pixel and the third pixel.

In an example, referring to FIG. 4B, the first magnetic field antenna 220a, the second magnetic field antenna 220b and the third magnetic field antenna 220c may have the same antenna structure and the same driving frequency, to transfer the same signal to a source electrode and a gate electrode of each of the first TFT 210a, the second TFT 210b and the third TFT 210c. In this example, magnetic field antennas 220a', 220b' and 220c' may be connected to a drain electrode of each of the first TFT 210a, the second TFT 210b and the third TFT 210c, and may have different antenna structures and different operating frequencies, to adjust a signal and ON/OFF operations of pixels.

In another example, the first magnetic field antenna 220a, the second magnetic field antenna 220b and the third magnetic field antenna 220c may have the same antenna structure and the same driving frequency, to transfer the same signal to a source electrode and a drain electrode of each of the first TFT 210a, the second TFT 210b and the third TFT 210c. In this example, magnetic field antennas 220a', 220b' and 220c' may be connected to a gate electrode of each of the first TFT 210a, the second TFT 210b and the third TFT 210c, and may have different antenna structures and different operating frequencies, to adjust a signal and ON/OFF operations of pixels.

Referring to FIG. 5, the additional magnetic field antenna 230 may be located in one side of the base substrate 200.

The additional magnetic field antenna 230 may be connected to the first magnetic field antenna 220a and the second magnetic field antenna 220b in an opposite direction to a direction in which the first TFT 210a and the second TFT 210b are connected to the first magnetic field antenna 220a and the second magnetic field antenna 220b, respectively, on the base substrate 200.

The additional magnetic field antenna 230 may be provided in a form of a planar coil, similarly to the first magnetic field antenna 220a, the second magnetic field antenna 220b and the third magnetic field antenna 220c, and may have a diameter greater than those of the first magnetic field antenna 220a, the second magnetic field antenna 220b and the third magnetic field antenna 220c.

Also, the additional magnetic field antenna 230 may be connected to the first TFT 210a, the second TFT 210b and the third TFT 210c.

For example, one end of the additional magnetic field antenna 230 may extend toward the first magnetic field antenna 220a and the second magnetic field antenna 220b and may diverge to be connected to a drain electrode of the first TFT 210a and a drain electrode of the second TFT 210b.

Accordingly, the first magnetic field antenna 220a, the second magnetic field antenna 220b and the third magnetic field antenna 220c may be connected to the first TFT 210a, the second TFT 210b and the third TFT 210c, respectively, to transmit and receive signals. The additional magnetic field antenna 230 may be connected to the first TFT 210a, the second TFT 210b and the third TFT 210c, to provide operating power. Also, the additional magnetic field antenna 230 may have a high diameter or a large number of turns, and accordingly may supply a large amount of operating power.

The TFT device 20 may include the additional magnetic field antenna 230 as shown in FIG. 5, however, there is no limitation thereto. Accordingly, the additional magnetic field antenna 230 may be connected to the magnetic field antenna 120 in the TFT device 10 of FIGS. 1A through 1C.

Referring to FIG. 6, the first magnetic field antenna 220a, the second magnetic field antenna 220b and the third magnetic field antenna 220c may have different structures.

For example, the first magnetic field antenna 220a, the second magnetic field antenna 220b and the third magnetic field antenna 220c may have different numbers of turns. The second magnetic field antenna 220b may have a largest number of turns, and the third magnetic field antenna 220c may have a smallest number of turns. Accordingly, in the first magnetic field antenna 220a, the second magnetic field antenna 220b and the third magnetic field antenna 220c, resonant frequencies may change differently from each other.

Thus, it is possible to operate a TFT selected from the TFTs 210 without interfering with an adjacent TFT, by changing a resonant frequency of each of the first magnetic field antenna 220a, the second magnetic field antenna 220b and the third magnetic field antenna 220c.

However, a method of changing a resonant frequency of each of the first magnetic field antenna 220a, the second magnetic field antenna 220b and the third magnetic field antenna 220c is not limited thereto, and various methods may be used.

In an example, the first magnetic field antenna 220a, the second magnetic field antenna 220b and the third magnetic field antenna 220c may change a width, a thickness or a spacing of each of the first magnetic field antenna 220a, the second magnetic field antenna 220b and the third magnetic field antenna 220c, to change a resonant frequency of each of the first magnetic field antenna 220a, the second magnetic field antenna 220b and the third magnetic field antenna 220c.

In another example, the base substrate 200 or the magnetic field antennas 220 may be covered by a medium that has a high permittivity or magnetic permeability in comparison to air, to change a resonant frequency. In this example, it is obvious that the base substrate 200, the first magnetic field antenna 220a, the second magnetic field antenna 220b and the third magnetic field antenna 220c may be covered with media having different permittivities or magnetic permeabilities.

As described above, the plurality of TFTs 210 may be connected to the plurality of magnetic field antennas 220, respectively, and thus it is possible to more easily control operations of the plurality of TFTs 210. Also, the plurality of magnetic field antennas 220 may have different structures, and thus it is possible to variously control the plurality of TFTs 210.

In addition, a driving of the above-described TFT device may be wirelessly controlled, or signals may be transmitted and received, and thus it is possible to prevent a TFT from being deactivated due to a short-circuit of a connection wiring. Also, the TFT device may be applicable to various electronic devices, for example, an implantable device and a subminiature wireless sensor (for example, an Internet of things (IoT) sensor) as well as a display (for example, a flexible display).

According to example embodiments, in a TFT device, a TFT may be connected to a magnetic field antenna so that a driving of the TFT may be wirelessly controlled and that signals may be wirelessly transmitted and received between the TFT and the magnetic field antenna.

Also, according to example embodiments, a TFT device may prevent a TFT from being deactivated due to a short-circuit of a connection wiring while maintaining a size effect of the TFT using a subminiature magnetic field antenna.

In addition, according to example embodiments, when a TFT device includes a plurality of TFTs, an interference between the plurality of TFTs may be minimized by changing a structure of a magnetic field antenna, and a portion of the plurality of TFTs may operate by changing a frequency of the magnetic field antenna.

Furthermore, according to example embodiments, a TFT device may be applied to various electronic devices, for example, an implantable device and a subminiature wireless sensor, as well as a display (for example, a flexible display). For example, the TFT device may wirelessly control each of pixels of a display.

While this disclosure includes specific example embodiments, it will be apparent to one of ordinary skill in the art that various changes in form and details may be made in these example embodiments without departing from the spirit and scope of the claims and their equivalents. The example embodiments described herein are to be considered in a descriptive sense only, and not for purposes of limitation. Descriptions of features or aspects in each example embodiment are to be considered as being applicable to similar features or aspects in other example embodiments. Suitable results may be achieved if the described techniques are performed in a different order, and/or if components in a described system, architecture, device, or circuit are combined in a different manner and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A thin-film transistor (TFT) device comprising:
a data line and a gate line formed on a base substrate;
a TFT connected to the data line and the gate line;
a magnetic field antenna spaced apart from the data line and the gate line on the base substrate,
wherein the magnetic field antenna is connected to the UT and configured to transmit and receive a signal to and from the TFT or to control a driving of the TFT;
wherein the TFT comprises:
 a source electrode and a drain electrode connected to the data line; and
 a gate electrode connected to the gate line,
wherein the magnetic field antenna is connected to at least one of the source electrode, the drain electrode or the gate electrode,
the TFT device further comprising:
an additional magnetic field antenna spaced apart from the magnetic held antenna and the TFT is located between the magnetic field antennas on the base substrate,
wherein one end of the magnetic field antenna is connected to the source electrode, and another end of the magnetic field antenna is connected to the gate electrode, and one end of the additional magnetic field antenna is connected to the source electrode, and another end of the additional magnetic field antenna is connected to the drain electrode.

2. The TFT device of claim 1, wherein the magnetic field antenna is provided in a form of a planar coil.

3. A thin-film transistor (TFT) device comprising:
a data line and a gate line formed on a base substrate;
a TFT connected to the data line and the gate line; and
a magnetic field antenna spaced apart from the data line and the gate line on the base substrate;
wherein the magnetic field antenna is connected to the TFT and configured to transmit and receive a signal to and from the TFT or to control a driving of the TFT;
wherein a core member formed of a magnetic material or a core member including a nanowire coated with a magnetic material is located in a central portion of the magnetic field antenna;
wherein:
the core member formed of the magnetic material is provided in a form of a circular plate to correspond to a shape of the central portion, and a top surface of the core member formed of the magnetic material is lower than a top surface of the magnetic field antenna; and a top surface of the core member including the nanowires hitcher than the top surface of the magnetic field antenna.

4. The TFT device of claim 3, wherein
an insulating member is located between the magnetic field antenna and at least one of the core members, or at least one of the core members is coated with an insulating material, and
the insulating member or the insulating material inhibits generation of an eddy current on a surface of at least one of the core members.

5. The TFT device of claim 1, wherein a diode and a capacitor are located between the magnetic field antenna and the TFT and are configured to convert an alternating current (AC) signal that is transmitted to the TFT into a direct current (DC) signal.

6. A thin-film transistor (TFT) device comprising:
a base substrate;
a first TFT connected to the base substrate;
a first magnetic field antenna connected to the first TFT and configured to control a driving of the first TFT;
a second TFT connected to the base substrate; and
a second magnetic field antenna connected to the second TFT and configured to control a driving of the second TFT,
wherein the first TFT and the second TFT are individually controlled by the first magnetic field antenna and the second magnetic field antenna;
wherein one end of the first magnetic field antenna is connected to a source electrode of the first TFT and another end of the first magnetic field antenna is connected to a gate electrode of the first TFT, and
one end of the second magnetic field antenna is connected to a source electrode of the second TFT and another end of the second magnetic field antenna is connected to a gate electrode of the second TFT.

7. The TFT device of claim 6, wherein
the first magnetic field antenna or the second magnetic field antenna is provided in a form of a planar coil, and
a resonant frequency of the first magnetic field antenna or the second magnetic field antenna changes by adjusting a number of turns, a width, a thickness or a spacing of the first magnetic field antenna or the second magnetic field antenna.

8. The TFT device of claim 6, wherein the first magnetic field antenna and the second magnetic field antenna are provided in forms of planar coils, and have different numbers of turns.

9. The TFT device of claim 6, further comprising:
an additional magnetic field antenna connected to the first magnetic field antenna and the second magnetic field antenna in an opposite direction tis a direction in which the first TFT and the second TFT are connected to the first magnetic field antenna and the second magnetic field antenna, respectively, on the base substrate.

10. The TFT device of claim 9, wherein a diameter of the additional magnetic field antenna is greater than a diameter of each of the first magnetic field antenna and the second magnetic field antenna.

11. The TFT device of claim 9, wherein
the first magnetic field antenna and the second magnetic field antenna are configured to transmit and receive signals to and from the first TFT and the second TFT, respectively, and
the additional magnetic field antenna is connected to each of the first TFT and the second TFT and configured to supply operating power to each of the first TFT and the second TFT.

12. The TFT device of claim 6, further comprising:
a first additional magnetic field antenna spaced apart from the first magnetic field antenna and the first TFT is located between the first additional magnetic field antenna and the first magnetic field antenna on the base substrate; and
a second additional magnetic field antenna spaced apart from the second magnetic field antenna and the second TFT is located between the second additional magnetic field antenna and the second magnetic field antenna on the base substrate.

13. The TFT device of claim 12, wherein
the first additional magnetic field antenna is connected to the source electrode and a drain electrode of the first TFT, and the second additional magnetic field antenna is connected to the source electrode and a drain electrode of the second TFT.

* * * * *